US007875947B2

(12) United States Patent
Moon et al.

(10) Patent No.: US 7,875,947 B2
(45) Date of Patent: Jan. 25, 2011

(54) FILTER, COLOR FILTER ARRAY, METHOD OF MANUFACTURING THE COLOR FILTER ARRAY, AND IMAGE SENSOR

(75) Inventors: Chang-rok Moon, Seoul (KR);
Koe-hyun Paik, Gyeonggi-do (KR);
Duck-hyung Lee, Gyeonggi-do (KR);
Sung-ho Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 989 days.

(21) Appl. No.: 11/668,120

(22) Filed: Jan. 29, 2007

(65) Prior Publication Data

US 2007/0187793 A1      Aug. 16, 2007

(30) Foreign Application Priority Data

Feb. 13, 2006   (KR)   .................. 10-2006-0013710

(51) Int. Cl.
*H01L 27/146*   (2006.01)
*H01L 31/0232*  (2006.01)

(52) U.S. Cl. .................. 257/440; 257/294; 257/432

(58) Field of Classification Search ................ 257/294, 257/432, 440; 359/586, 587, 588, 619; 250/208.1, 250/214.1; 348/272, 273, 280; 358/512
See application file for complete search history.

(56) References Cited

U.S. PATENT DOCUMENTS 5,246,803 A *   9/1993   Hanrahan et al. .............. 430/7
6,317,179 B1 *  11/2001  Kamiya ....................... 349/78

FOREIGN PATENT DOCUMENTS

| EP | 0 223 136 A2 | 10/1986 |
| EP | 1 592 067 A1 | 11/2005 |
| JP | 63-172461 | 7/1998 |
| KR | 1020000061177 A | 10/2000 |
| KR | 1020020027016 A | 4/2002 |
| KR | 1020030002125 A | 1/2003 |

OTHER PUBLICATIONS

Preliminary Notice of the First Office Action; Apr. 29, 2010; corresponding Taiwanese Patent Application No. 09920285330 (5 pages).

* cited by examiner

*Primary Examiner*—David Nelms
*Assistant Examiner*—Tai Duong
(74) *Attorney, Agent, or Firm*—Myers Bigel Sibley & Sajovec (57) ABSTRACT

Provided are color filters formed of alternately stacked inorganic materials having different refractive indices, a color filter array, a method of manufacturing the color filter array, and an image sensor. A color filter can include a substrate and first and second inorganic films configured to filter light of a specific wavelength corresponding to a predetermined color, wherein the first and second inorganic films can be alternately stacked on the substrate and have different refractive indices from each other. The refractive index difference between the first inorganic film and the second inorganic film is at least 0.8. The color filter can be formed by alternately stacking the first and second inorganic films. The first inorganic film and the second inorganic film can have a refractive index of 1.3 to 6.0 in a visible light region of 400 to 700 nm, and can be formed of a material selected from the group consisting of $SiO_2$, SiON, SiN, and Si.

11 Claims, 8 Drawing Sheets

FILTER, COLOR FILTER ARRAY, METHOD OF MANUFACTURING THE COLOR FILTER ARRAY, AND IMAGE SENSOR

CROSS-REFERENCE TO RELATED PATENT APPLICATION

This application claims the benefit of Korean Patent Application No. 10-2006-0013710, filed on Feb. 13, 2006, in the Korean Intellectual Property Office, the disclosure of which is incorporated herein in its entirety by reference.

BACKGROUND OF THE INVENTION

1. Field of the Invention

The present invention relates to an image sensing, and more particularly, to a color filtering and methods of manufacturing the same.

2. Description of the Related Art

Image sensors are devices that can transform optical information to electrical signals, and can include charge coupled device (CCD) image sensors and CMOS image sensors, among others. A CMOS image sensor can have advantages in terms of simplicity of operation, miniaturization and manufacturing cost reduction, which can be possible due to the integration of signal processing circuits and low power consumption. A CMOS sensor can sequentially output data by switching operations of MOS transistors disposed in each pixel in a pixel array.

Figure 1:
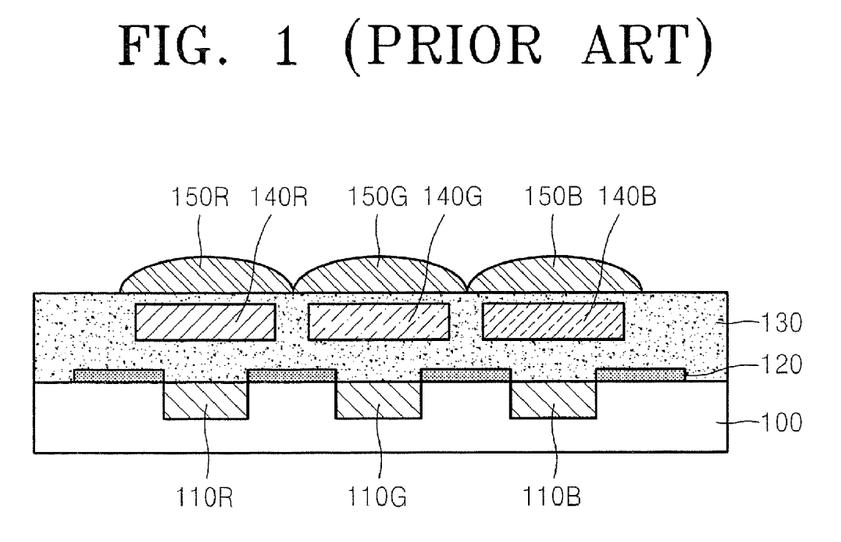
FIG. 1 is a cross-sectional view of a conventional CMOS image sensor.

A CMOS image sensor can include an optical sensor unit that can generate optical charge by sensing external light. A CMOS image sensor can also include a color filter array arranged on the optical sensor unit. FIG. 1 is a cross-sectional view of a conventional CMOS image sensor. Referring to FIG. 1, a plurality of photo diode regions 110R, 110G, and 110B can be formed on a semiconductor substrate 100, and light shielding layers 120 can be formed on the semiconductor substrate 100 between the photo diode regions 110R, 110G, and 110B so that the photo diode regions 110R, 110G, and 110B can be exposed. A plurality of color filters 140R, 140G, and 140B can be arranged on the semiconductor substrate 100 corresponding to the photo diode regions 110R, 110G, and 110B. Micro lenses 150R, 150G, and 150B can be arranged on the semiconductor substrate 100 corresponding to the color filters 140R, 140G, and 140B. An interlayer insulating film 130 can be interposed between the light shielding layer 120, the color filters 140R, 140G, and 140B, and the micro lenses 150R, 150G, and 150B.

Figure 2:
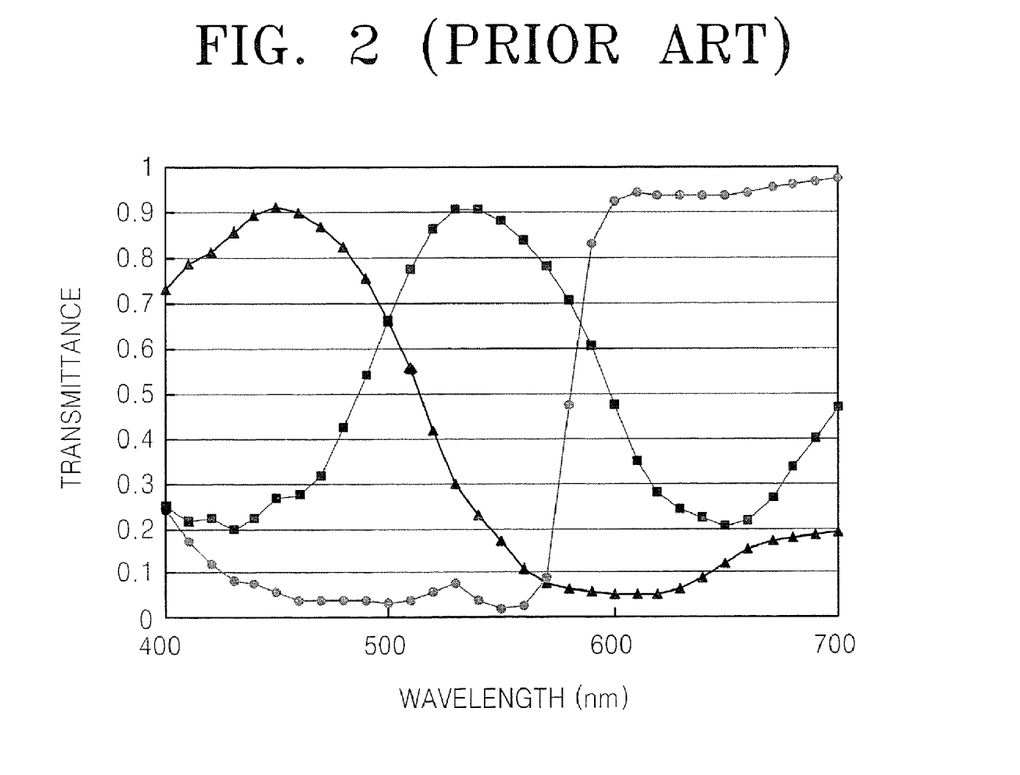
FIG. 2 is a graph showing optical transmittance of the conventional CMOS image sensor of FIG. 1.

In a conventional image sensor, the color filter can be an organic color filter, and can be formed by mixing dye or pigment in a negative photoresist. The organic color filter can include non-uniform particle sizes, and accordingly, transmittance of pixels may not be uniform, thereby resulting in defects such as black spots. Also, it can be difficult to form a pattern having a small pitch, and, as illustrated in FIG. 2, which shows optical transmittance of the conventional CMOS image sensor, there can be a greater possibility of color crosstalk.

SUMMARY OF THE INVENTION

Embodiments of the present invention can include a color filter that can reduce defects and color crosstalk by alternately stacking inorganic material films having different refractive indices from each other.

Some embodiments can include a color filter array having a plurality of color filters in which inorganic material films having different refractive indices from each other are alternately stacked and a method of manufacturing the color filter array.

Further embodiments can include an image sensor having a color filter in which inorganic material films having different refractive indices from each other are alternately stacked and a method of manufacturing the image sensor.

According to an aspect of the present invention, a color filter can include a substrate on which is alternately stacked a first inorganic film and a second inorganic film configured to filter light of a specific wavelength corresponding to a predetermined color and having different refractive indices from each other. The refractive index difference between the first inorganic film and the second inorganic film is 0.8 or greater. The color filter is formed by alternately stacking the first and second inorganic films 2 to 5 times. The first inorganic film and the second inorganic film have a refractive index range of 1.3 to 6.0 in a visible light region of 400 to 700 nm, and formed of a material selected from the group consisting of $SiO_2$, SiON, SiN, and Si.

In some embodiments, the first inorganic film and the second inorganic film are formed respectively to thicknesses of 600-800 Å and 100-200 Å by alternately stacking a silicon oxide film and silicon film 2 to 5 times when filtering light having the specific wavelength corresponding to a red color. In some embodiments, the first inorganic film and the second inorganic film are formed respectively to thicknesses of 700-1100 Å and 500-800 Å by alternately stacking a silicon oxide film and silicon film 2 to 5 times, or to thicknesses of 800-1200 Å and 600-1000 Å by alternately stacking a silicon oxynitride film and a silicon oxide film 2 to 5 times when filtering light having the specific wavelength corresponding to a green color. In some embodiments, the first inorganic film and the second inorganic film are formed respectively to thicknesses of 300-600 Å and 400-800 Å by alternately stacking a silicon film and silicon nitride film 2 to 5 times when filtering light having the specific wavelength corresponding to a blue color.

In other embodiments, a color filter array for an image sensor can include a semiconductor substrate, a first color filter, a second color filter, and a third color filter. The first color filter, which can be configured to filter light having a first wavelength corresponding to a first color, can include first and second inorganic films that are alternately stacked on the semiconductor substrate and have different refractive indices from each other. The second color filter, which can be configured to filter light having a second wavelength corresponding to a second color, can include third and fourth inorganic films that are alternately stacked on the semiconductor substrate and have different refractive indices from each other. The third color filter, which can be configured to filter light having a third wavelength corresponding to a third color, can include fifth and sixth inorganic films which are alternately stacked on the semiconductor substrate and have different refractive indices from each other. In some embodiments, the refractive index difference between the first inorganic film and the second inorganic film of the first color filter is 0.8 or greater, the refractive index difference between the third inorganic film and the fourth inorganic film of the second color filter is 0.8 or greater, and the refractive index difference between the fifth inorganic film and the sixth inorganic film of the third color filter is 0.8 or greater.

In some embodiments, a method of manufacturing a color filter array for an image sensor can include forming a first inorganic film and a second inorganic film having a refractive index difference of 0.8 or more by alternately stacking first and second inorganic film materials 2 to 5 times on a semiconductor substrate. A first color filter of a first color can be formed by patterning the first and second inorganic films. Third and fourth inorganic films having a refractive index difference of 0.8 or more can be formed by alternately stacking third and fourth and inorganic film materials 2 to 5 times on the first color filter and the semiconductor substrate. A second color filter of a second color separated from the first color filter can be formed by patterning the third and fourth inorganic films. Fifth and sixth inorganic films having a refractive index difference of 0.8 or more can be formed by alternately stacking fifth and sixth inorganic film materials 2 to 5 times on the first and second color filters and the semiconductor substrate. A third color filter of a third color separated from the first and second color filters can be formed by patterning the fifth and sixth inorganic films.

Yet other embodiments can be an image sensor that includes a semiconductor substrate and multiple of dopant regions, configured to sense light, formed in the semiconductor substrate. The image sensor can also include multiple color filters arranged corresponding to the dopant regions and formed by alternately stacking first and second inorganic film materials having a refractive index difference of 0.8 or more and multiple micro lenses arranged on the semiconductor substrate corresponding to each of the multiple color filters. The image sensor can further include an insulating film interposed between the semiconductor substrate and the micro lenses.

In yet further embodiments, a CMOS image sensor can include multiple first dopant regions configured to sense light and multiple second dopant regions configured as source/drain regions. The first and second dopant regions can be separated from each other in the semiconductor substrate. A gate insulating film can be formed on the semiconductor substrate and multiple gate electrodes can be formed on the gate insulating film between the first dopant regions and the second dopant regions. Multiple color filters can be arranged corresponding to each of the first dopant regions and formed by alternately stacking 2 to 5 times of a first inorganic film material and a second inorganic film material having a refractive index difference of 0.8 or more. A first interlayer insulating film can be formed on the gate electrodes and the gate insulating film, and a first metal wire can be arranged on the first insulating film that does not correspond to the first dopant regions. A second interlayer insulating film can be formed on the first metal wire and the first interlayer insulating film, and a second metal wire can be arranged on the second interlayer insulating film that does not correspond to the first dopant regions. A third interlayer insulating film can be formed on the second metal wire and the second interlayer insulating film, and a third metal wire can be arranged on the third interlayer insulating film that does not correspond to the first dopant regions. A fourth interlayer insulating film can be formed on the third metal wire and the third interlayer insulating film, and a plurality of micro lenses are arranged on the fourth interlayer insulating film corresponding to each of the color filters.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein, rather, these embodiments are provided so that this disclosure will be thorough and complete, and will fully convey the concept of the invention to those skilled in the art. In the drawings, the thicknesses of layers and regions are exaggerated for clarity. Like reference numerals refer to like elements throughout the drawings.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
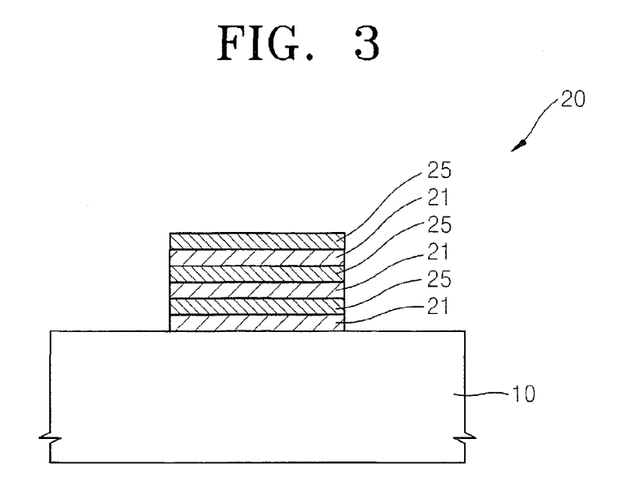
FIG. 3 is a cross-sectional view of a color filter according to some embodiments of the present invention.

FIG. 3 is a cross-sectional view of a color filter 20 according to some embodiments of the present invention. Referring to FIG. 3, the color filter 20 includes a substrate 10 and first and second inorganic films 21 and 25, which are alternately stacked and have different refractive indices from each other. The substrate 10 may include a semiconductor substrate. The first inorganic film 21 and the second inorganic film 25 can include an inorganic material having a refractive index of 1.3 to 6.0 in a visible light region of 400 to 700 nm. The first inorganic film 21 can be formed of an inorganic material having a high refractive index and the second inorganic film 25 can be formed of an inorganic material having a low refractive index.

In some embodiments, the refractive index difference between the first inorganic film 21 and the second inorganic film 25 may be at least 0.8 or more. If the refractive index difference is small, the quantity of layers of stacked first inorganic film 21 and the second inorganic film 25 can be increased. Accordingly, as the height of the stacked color filters increases, formation of the color filter can be increasingly difficult. Also, the increase in the vertical thickness of the color filter is disadvantageous for obtaining high integration of the image device. Accordingly, in the color filter 20 of some embodiments, the refractive index difference between the first inorganic film 21 and the second inorganic film 25 can be at least 0.8, and the first inorganic film 21 and the second inorganic film 25 can be alternately stacked five times or less. For example, the first inorganic film 21 and the second inorganic film 25 can be alternately stacked from two to five times.

Figure 4A:
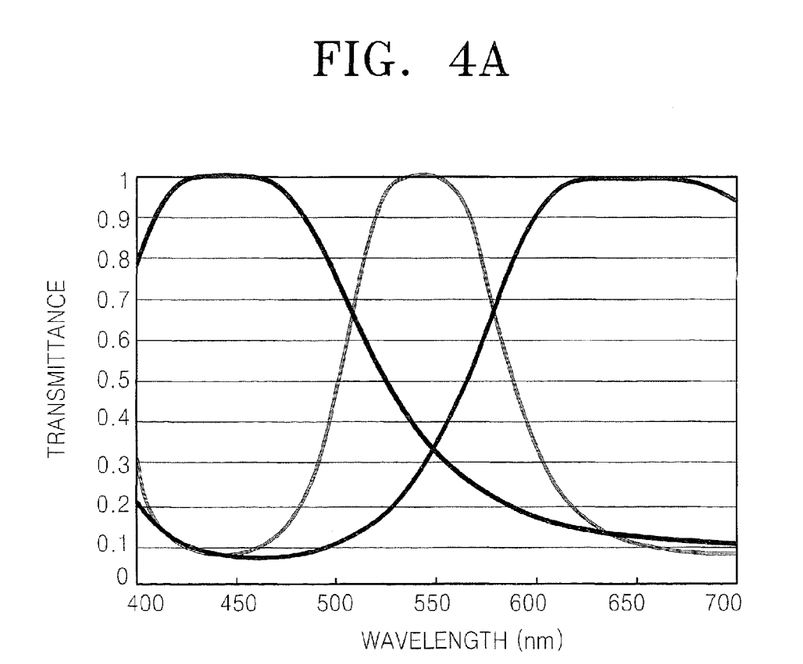
FIG. 4A is a graph showing optical transmittance of a color filter, in which two inorganic material films having different refractive indices are alternately deposited twice, according to some embodiments of the present invention.
Figure 4B:
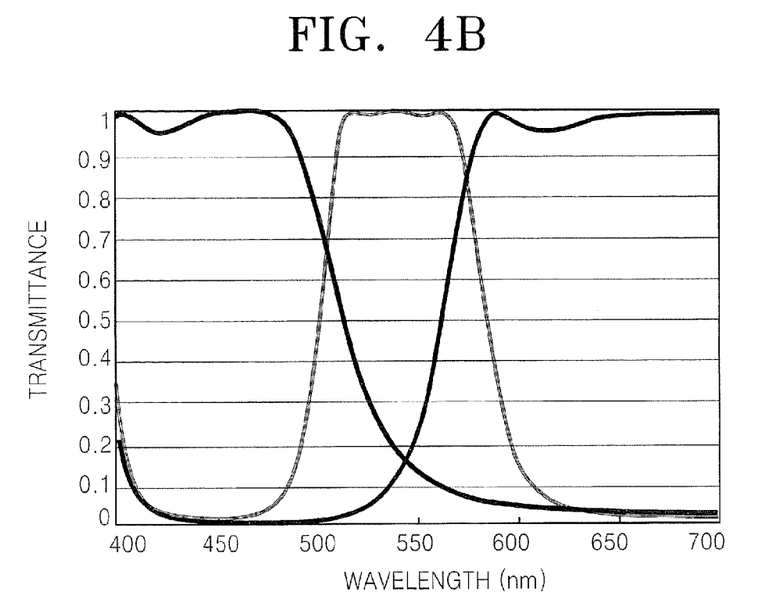
FIG. 4B is a graph showing optical transmittance of a color filter, in which three inorganic material films having different refractive indices are alternately deposited three times, according to some embodiments of the present invention.

FIG. 4A is a graph showing optical transmittances of red R, green G, and blue B colors of a color filter when the first inorganic film 21 and the second inorganic film 25 are stacked twice. FIG. 4B is a graph showing optical transmittances of red R, green G, and blue B colors of a color filter when the first inorganic film 21 and the second inorganic film 25 are stacked three times. A silicon film having a high refractive index can be used as the first inorganic film 21, and a silicon oxide film having a low refractive index can be used as the second inorganic film 25. A color filter according to some embodiments of the present invention, include first and the second inorganic films 21 and 25 having the refractive index difference greater than 0.8 are alternately stacked on a substrate. The color filter 20 can have a higher optical transmittance and superior color separation capability of red R, green G, and blue B colors relative to those of a conventional color filter. In particular, the optical transmittance of the color filter is higher when the inorganic films are stacked three times versus when they are stacked two times.

When the color filter is a red R filter, a silicon oxide film and a silicon film can be used as the first inorganic film 21 and the second inorganic film 25, respectively, and can be deposited to a thickness of 600-800 Å and 100-200 Å by alternately stacking the silicon oxide film and the silicon film from two to five times. When the color filter is a blue B filter, a silicon film and a silicon oxide film can be used as the first inorganic film 21 and the second inorganic film 25, respectively, and can be deposited to a thickness of 300-600 Å and 400-800 Å by alternately stacking the silicon film and the silicon oxide film from two to five times.

When the color filter is green G filter, a silicon oxide film and a silicon film can be used as the first inorganic film 21 and the second inorganic film 25, respectively, and can be deposited to a thickness of 700-1100 Å and 500-800 Å by alternately stacking the silicon oxide film and the silicon film from two to five times. When a silicon oxynitride film and a silicon oxide film are used as the first inorganic film 21 and the second inorganic film 25, respectively, the first inorganic film 21 and the second inorganic film 25 can be deposited to a thickness of 800-1200 Å and 600-1000 Å by alternately stacking the silicon oxynitride film and the silicon oxide film from two to five times.

In the present embodiment, an inorganic material film having a low refractive index can be used as the first inorganic film 21 and an inorganic material having a high refractive index can be used as the second inorganic film 25. In some embodiments, the first inorganic film 21 and the second inorganic film 25 can be selected so that the refractive index difference between the first inorganic film 21 and the second inorganic film 25 is at least 0.8 where the first inorganic film 21 has a low refractive index relative to the second inorganic film 25.

Figure 5:
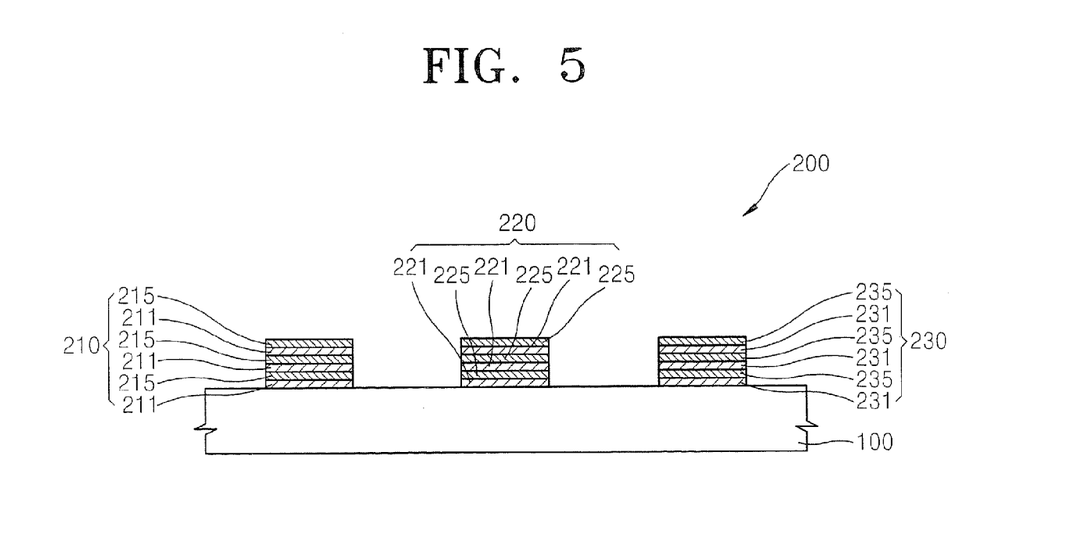
FIG. 5 is a cross-sectional view of a color filter array for an image sensor according to some embodiments of the present invention.

FIG. 5 is a cross-sectional view of a color filter array 200 for an image sensor for realizing a full color image, according to some embodiments of the present invention. Referring to FIG. 5, the color filter array 200 includes a semiconductor substrate 100, a red R filter 210, a green G filter 220, and a blue B filter 230. The red R filter 210 includes a first inorganic film 211 and a second inorganic film 215 having different refractive indices from each other. The green G filter 220 includes a first inorganic film 221 and a second inorganic film 225 having different refractive indices from each other. The blue B filter 230 includes a first inorganic film 231 and a second inorganic film 235 having different refractive indices from each other.

The first inorganic films 211, 221, and 231 of the red R, green G, and blue B filters 210, 220, and 230 may include different inorganic materials from each other or at least one of the first inorganic films 211, 221, and 231 may be formed of an inorganic material different from the others. Also, the second inorganic films 215, 225, and 235 of the red R, green G, and blue B filters 210, 220, and 230 may include different inorganic materials from each other or at least one of the second inorganic films 215, 225, and 235 may be formed of an inorganic material different from the others.

The red R filter 210 includes the first inorganic film 211 having a low refractive index and the second inorganic film 215 having a high refractive index, alternately stacked. The first inorganic film 211 and the second inorganic film 215 that constitute the red R filter 210 have a refractive index difference of 0.8 or more, and are alternately stacked from two to five times. In some embodiments, the first inorganic film 211 and the second inorganic film 215 are alternately stacked three times. The first inorganic film 211 can include a silicon oxide film having a thickness of 600-800 Å, and the second inorganic film 215 can include a silicon film having a thickness of 100-200 Å.

The green G filter 220 can include the first inorganic film 221 having a low refractive index and the second inorganic film 225 having a high refractive index, alternately stacked. The first inorganic film 221 and the second inorganic film 225 that constitute the green G filter 220 can have a refractive index difference of 0.8 or more, and are alternately stacked from two to five times. In some embodiments, the first inorganic film 221 and the second inorganic film 225 are alternately stacked three times. The first inorganic film 221 can include a silicon oxide film having a thickness of 700-1100 Å, and the second inorganic film 225 can include a silicon film having a thickness of 500-800 Å. Also, the first inorganic film 221 can include a silicon oxynitride film having a thickness of 800-1200 Å, and the second inorganic film 225 can include a silicon oxide film having a thickness of 600-1000 Å.

The blue B filter 230 can include the first inorganic film 231 having a high refractive index and the second inorganic film 235 having a low refractive index, alternately stacked. The first inorganic film 231 and the second inorganic film 235 that constitute the blue B filter 230 can have a refractive index difference of 0.8 or more, and can be alternately stacked from two to five times. In some embodiments, the first inorganic film 231 and the second inorganic film 235 can be alternately stacked three times. The first inorganic film 231 can include a silicon film having a thickness of 300-600 Å, and the second inorganic film 235 can include a silicon nitride film having a thickness of 400-800 Å.

In the color filter array 200, the first inorganic films 211, 221, and 231 of the red R, green G, and blue B filters 210, 220, and 230 can be formed of inorganic films having a low refractive index, and the second inorganic films 215, 225, and 235 can be formed of inorganic films having a high refractive index.

Figure 6:
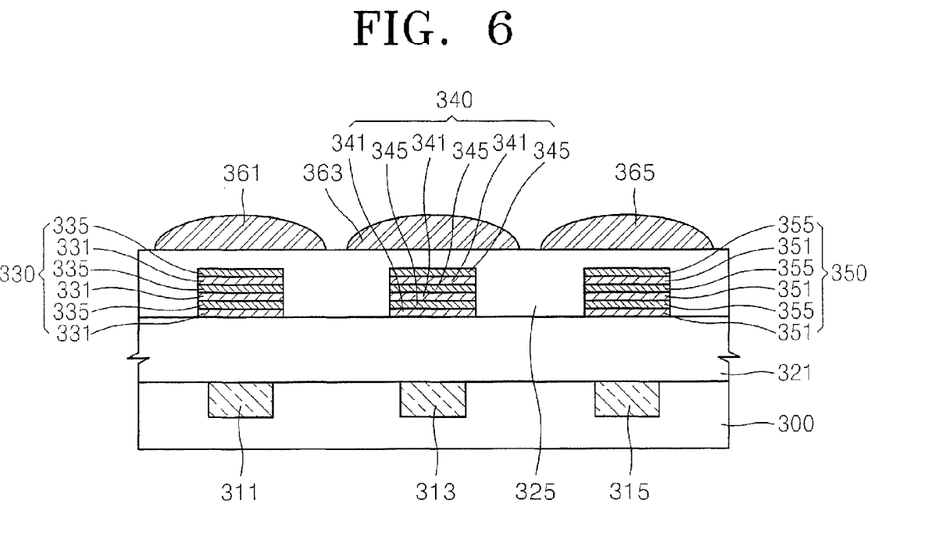
FIG. 6 is a cross-sectional view of an image sensor according to some embodiments of the present invention.

FIG. 6 is a cross-sectional view of an image sensor according to some embodiments of the present invention. Referring to FIG. 6, the image sensor can include a plurality of photodiode regions 311, 313, and 315 formed in a semiconductor substrate 300, a plurality of color filters 330, 340, and 350 arranged corresponding to the photodiode regions 311, 313, and 315, and a plurality of micro lenses 361, 363, and 365 arranged corresponding to the color filters 330, 340, and 350.

The image sensor can further include an interlayer insulating film 321 interposed between the semiconductor substrate 300 and the color filters 330, 340, and 350 and a planarizing film 325 formed on the interlayer insulating film 321 to cover the color filters 330, 340, and 350.

The color filters 330, 340, and 350 respectively include red, green, and blue color filters, and can be formed by alternately stacking first and second inorganic films 331 and 335, 341 and 345, and 351 and 355 from two to five times, such that the first and second inorganic films 331 and 335, 341 and 345, and 351 and 355 can have a refractive index difference of 0.8 or more. The first inorganic film 331 of the red color filter 330 can include a silicon oxide film having a thickness of 600-800 Å, and the second inorganic film 335 can include a silicon film having a thickness of 100-200 Å. The first inorganic film 341 of the green color filter 340 can include a silicon oxide film having a thickness of 700-1100 Å or a silicon oxynitride film having a thickness of 800-1200 Å, and the second inorganic film 345 can include a silicon film having a thickness of 500-800 Å or a silicon oxide film having a thickness of 600-1000 Å. The first inorganic film 351 of the blue color filter 350 can include a silicon film having a thickness of 300-600 Å and the second inorganic film 355 can include a silicon nitride film having a thickness of 400-800 Å.

In some embodiments, an optimum light emission efficiency of each red, green, and blue color can be obtained by forming the first inorganic film and the second inorganic film of the color filters using an optimum material, an optimum thickness, and an optimized number of stacked quantities. In some embodiments, the image sensor can includes red, green, and blue color filters 330, 340, and 350, but the present invention is not limited thereto, and may include bluish green, yellow, and purplish red color filters formed of different inorganic films having a refractive index difference of 0.8 or more. Also, the image sensor may include at least one of the red, green, and blue color filters.

Figure 7A:
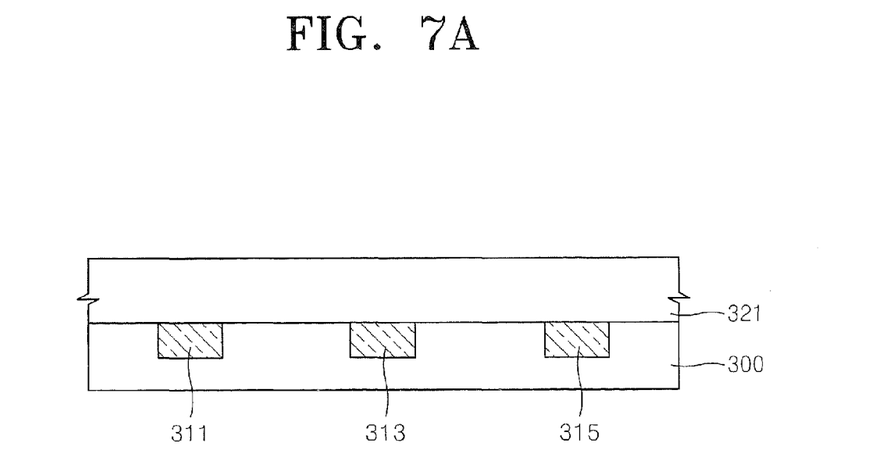
FIGS. 7A through 7G are cross-sectional views for explaining a method of manufacturing an image sensor according to some embodiments of the present invention.

FIGS. 7A through 7G are cross-sectional views illustrating a method of manufacturing an image sensor having an inorganic color filter according some embodiments of the present invention. Referring to FIG. 7A, a plurality of dopant regions 311, 313, and 315 can be formed by ion implantation of a dopant having an opposite conductivity to a semiconductor substrate 300 in the semiconductor substrate 300. The dopant regions 311, 313, and 315 can be photodiode regions 311, 313, and 315 of the image sensor. An interlayer insulating film 321 can be formed on the semiconductor substrate 300 having the photodiode regions 311, 313, and 315.

Figure 7B:
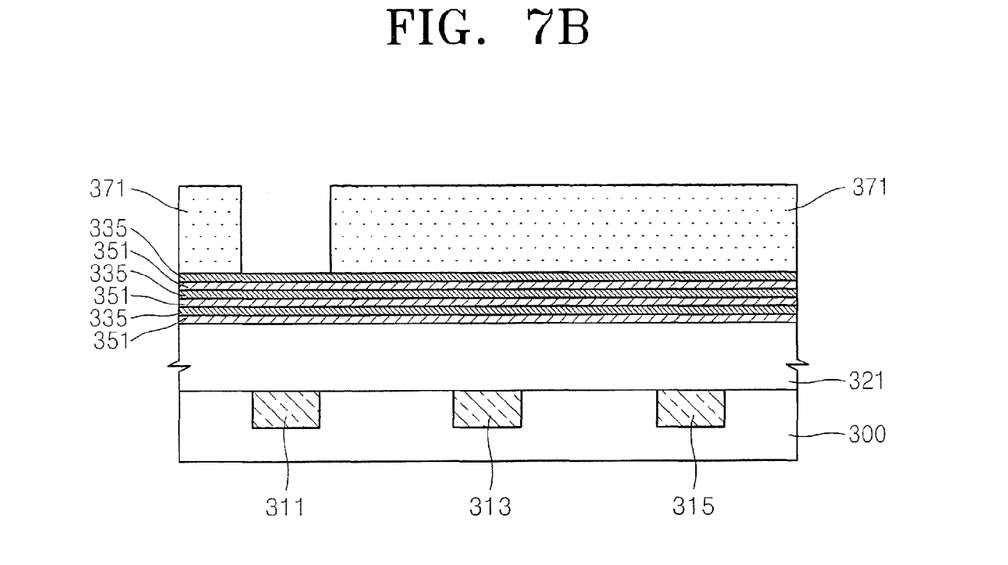
Figure 7C:
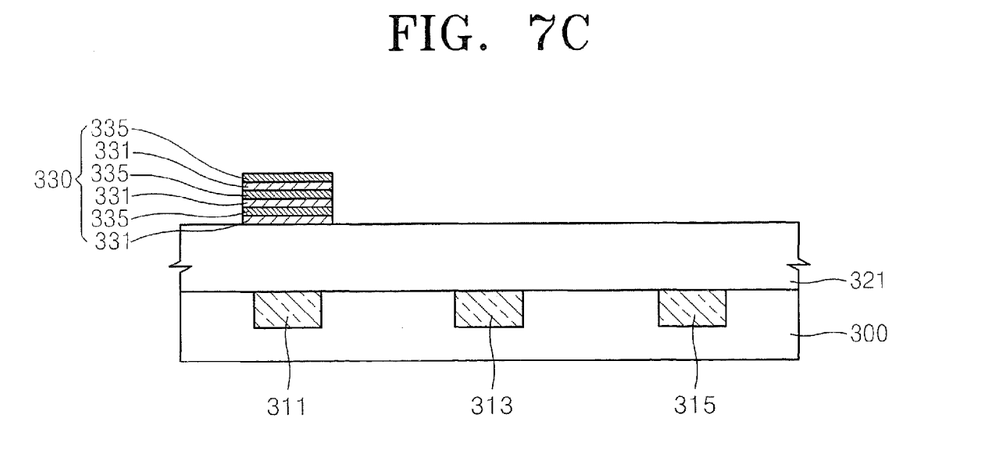

Referring to FIGS. 7B and 7C, a silicon oxide film 331 and a silicon film 335 can be alternately stacked three times on the interlayer insulating film 321. The silicon oxide film 331 can be formed to a thickness of 600-800 Å, and the silicon film 335 can be formed to a thickness of 100-200 Å. A photosensitive film 371 can be formed on the silicon film 335 exposing the silicon film 335 corresponding to the first photodiode region 311. A red color filter 330 can be formed by etching the silicon film 335 and the silicon oxide film 331 using the photosensitive film 371.

Figure 7D:
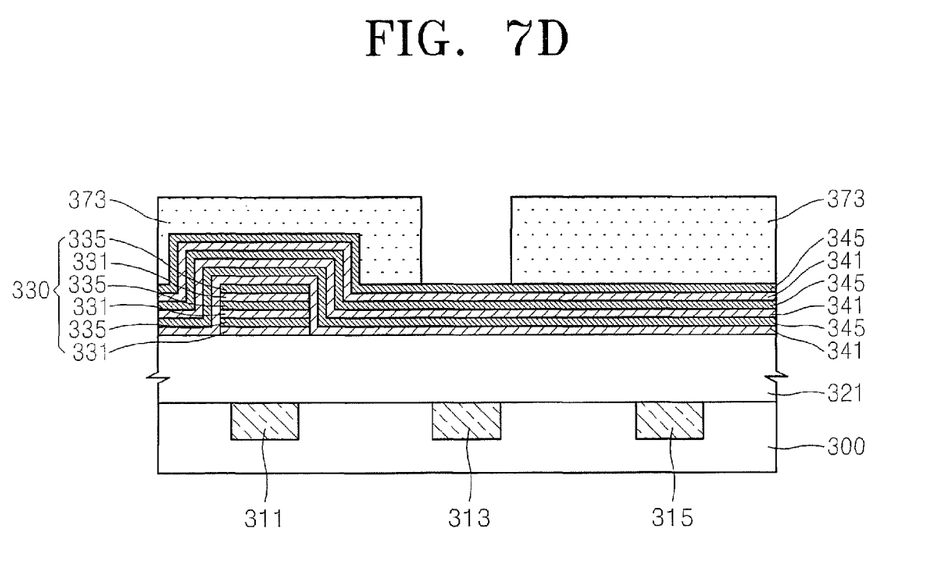
Figure 7E:
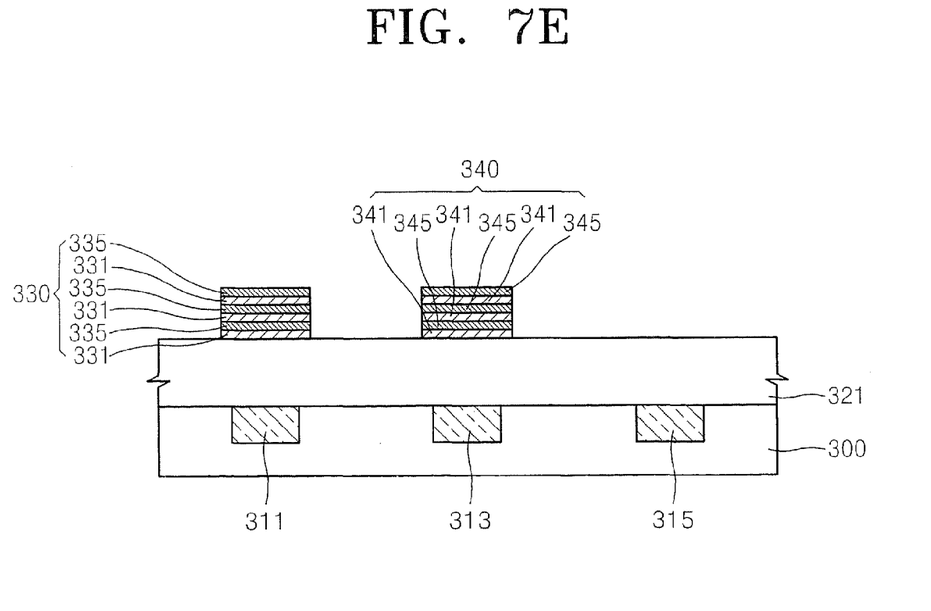

Referring to FIGS. 7D and 7E, a silicon oxide film 341 and a silicon film 345 can be alternately deposited three times on the interlayer insulating film 321 where the red color filter 330 is formed. The silicon oxide film 341 can be formed to a thickness of 700-1100 Å, and the silicon film 345 can be formed to a thickness of 500-800 Å. A photosensitive film 373 can be formed on the silicon film 345 exposing the silicon film 345 corresponding to the second photodiode regions 313. A green color filter 340 can be formed by etching the silicon film 345 and the silicon oxide film 341 using the photosensitive film 373. The green color filter 340 can have a stacking structure in which a silicon oxynitride film having a thickness of 800-1200 Å and silicon oxide film having a thickness of 600-1000 Å can be formed.

Figure 7F:
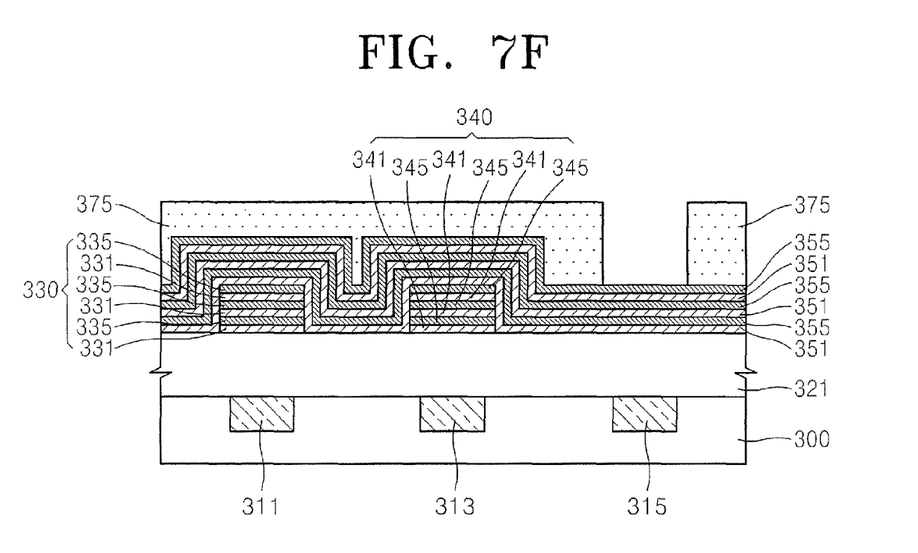
Figure 7G:
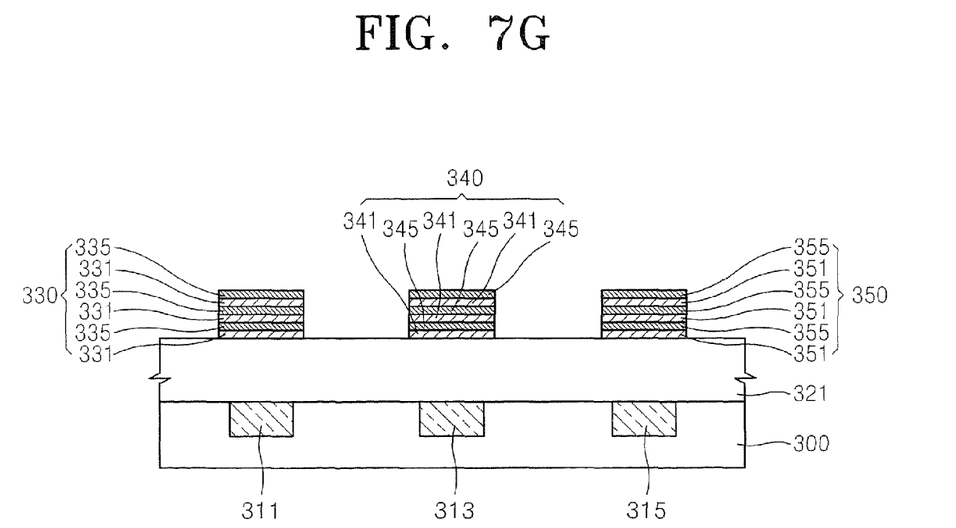

Referring to FIGS. 7F and 7G, a silicon film 351 and a silicon nitride film 355 can be alternately deposited three times on the interlayer insulating film 321 where the red color filter 330 and the green color filter 340 are formed. The silicon film 351 can be formed to a thickness of 300-600 Å, and the silicon nitride film 355 can be formed to a thickness of 400-800 Å. A photosensitive film 375 can be formed on the silicon nitride film 355 exposing the silicon nitride film 355 corresponding to the third photodiode regions 315. A blue color filter 350 can be formed by etching the silicon nitride film 355 and the silicon film 351 using the photosensitive film 375.

Next, a planarizing film 325 covering the red, green, and blue color filters 330, 340, and 350 can be formed on the interlayer insulating film 321, as shown in FIG. 6. A plurality of micro lenses 361, 363, and 365 can be formed corresponding to the red, green, and blue color filters 330, 340, and 350 on the planarizing film 325. In this way, the image sensor of FIG. 6 can be manufactured. As another example, the red, green, and blue color filters 330, 340, and 350 can be directly formed on the semiconductor substrate 300 corresponding to the photodiode regions 311, 313, and 315 using the above color filter forming process, and the micro lenses 361, 363, and 365 can be formed on the interlayer insulating film 321 without the planarizing film 325.

Figure 8:
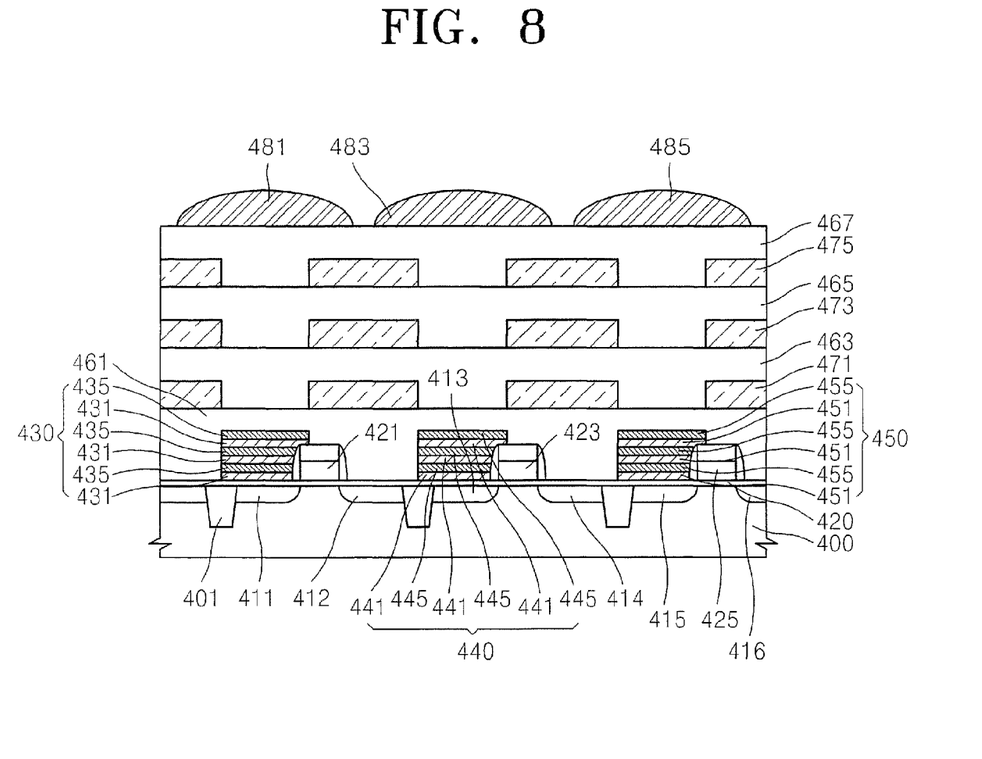
FIG. 8 is a cross-sectional view of a CMOS image sensor according to some embodiments of the present invention.

FIG. 8 is a cross-sectional view of a CMOS image sensor having an inorganic color filter according to some embodiments of the present invention. Referring to FIG. 8, first dopant regions 411, 413, and 415 for a plurality of photodiode regions and second dopant regions 412, 414, and 416 for source (or drain) regions can be disposed some distance from each other in a semiconductor substrate 400. A gate insulating film 420 can be formed on the semiconductor substrate 400, and gate electrodes 421, 423, and 425 and red, green, and blue color filters 430, 440, and 450 can be formed on the gate insulating film 420.

The red, green, and blue color filters 430, 440, and 450 can include, respectively, first inorganic films 431, 441, and 451 and second inorganic films 435, 445, and 455, which can be alternately stacked three times and have a refractive index difference of 0.8 or more. The first inorganic film 431 and the second inorganic film 435 of the red color filter 430 can be respectively formed to a thickness of 600-800 Å using a silicon oxide film, and to a thickness of 100-200 Å using a silicon film. The first inorganic film 441 and the second inorganic film 445 of the green color filter 440 can be respectively formed to thicknesses of 700-1100 Å and 500-800 Å using a silicon oxide film and a silicon film, or can be respectively formed to thicknesses of 800-1200 Å and 600-1000 Å using a silicon oxynitride film and a silicon oxide film. The first inorganic film 451 and the second inorganic film 455 of the blue color filter 450 can be respectively formed to thicknesses of 300-600 Å and 400-800 Å using silicon film and silicon nitride film.

A first interlayer insulating film 461 covering the red, green, and blue color filters 430, 440, and 450 and the gate electrodes 421, 423, and 425 can be formed on the gate insulating film 420. A first metal wire 471 can be formed on the first interlayer insulating film 461 that does not correspond to the first dopant regions 411, 413, and 415, that is, the red, green, and blue color filters 430, 440, and 450. A second interlayer insulating film 463 can be formed on the first metal wire 471 and the first interlayer insulating film 461, and a second metal wire 473 can be formed on the second interlayer insulating film 463 that does not correspond to the first dopant regions 411, 413, and 415, that is, the red, green, and blue color filters 430, 440, and 450. A third interlayer insulating film 465 can be formed on the second metal wire 473 and the second interlayer insulating film 463. A third metal shire 475 can be formed on the third interlayer insulating film 465 that does not correspond to the first dopant regions 411, 413, and 415, that is, the red, green, and blue color filters 430, 440, and 450. A fourth interlayer insulating film 467 can be formed on the third metal wire 475 and the third interlayer insulating film 465. Micro lenses 481, 483, and 485 can be arranged on the fourth interlayer insulating film 467 corresponding to the first dopant regions 411, 413, and 415, that is, the red, green, and blue color filters 430, 440, and 450.

The structure of the CMOS image sensor according to the present invention is not limited to the structure depicted in FIG. 8, and can have various strictures. For example, the red, green, and blue color filters 430, 440, and 450 can be formed on the first interlayer insulating film 461 together with the first metal wire 471, can be formed oil the second interlayer insulating film 463 together with the second metal wire 473, or can be formed on the third interlayer insulating film 465 together with the third metal wire 475. Also, the red, green and blue color filters can be formed on the fourth interlayer insulating film 467 and a planarizing film can be interposed between the fourth interlayer insulating film 467 and the micro lenses 481, 483, 485.

As described above, a color filter in some embodiments according to the present invention and a CMOS image sensor having the color filter can reduce the need for a protective film and a planarizing film interposed between a color filter and a micro lens. Instead an inorganic film can be formed at the same level as a gate electrode on a semiconductor substrate, thereby simplifying the manufacturing process and enabling high integration due to the reduction of the vertical thickness of the image sensor. Also, the number of times first and second inorganic films are stacked can be reduced by forming the first and the second inorganic films that constitute a color filter using inorganic materials having a refractive index difference of greater than a predetermined level. Accordingly, it may be advantageous for high integration of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor comprising:
 a semiconductor substrate;
 a plurality of dopant regions, configured to sense light, formed in the semiconductor substrate;
 a plurality of color filters arranged corresponding to the dopant regions and formed by alternately stacking a first inorganic film and a second inorganic film, wherein the first inorganic film and the second inorganic film are formed of a material selected from the group consisting of $SiO_2$, SiON, SiN, and Si, respectively, and wherein the first inorganic film and the second inorganic film are formed of materials having a refractive index difference of about 0.8 or more;
 a plurality of micro lenses arranged on the semiconductor substrate corresponding to each of the plurality of color filters; and
 an insulating film interposed between the semiconductor substrate and the plurality of micro lenses, wherein the plurality of color filters comprise red, green, and blue color filters, and wherein at least one of the first inorganic films of the red, green, and blue color filters is formed of an inorganic material different from the others of the red, green, and blue color filters, and at least one of the second inorganic films of the red, green, and blue color filters is formed of an inorganic material different from the others of the red, green, and blue color filters.

2. The image sensor of claim 1, wherein the red color filter comprises a silicon oxide film having a thickness of 600-800 Å as the first inorganic film and a silicon film having a thickness of 100 to 200 Å as the second inorganic film, and
wherein the red color filter comprises the silicon oxide film and the silicon film alternatively stacked 2 to 5 times.

3. The image sensor of claim 1, wherein the green color filter comprises a silicon oxide film having a thickness of 700-1100 Å as the first inorganic film and a silicon film having a thickness of 500-800 Å as the second inorganic film alternately stacked 2 to 5 times, or comprises a silicon oxynitride film having a thickness of 800-1200 Å as the first inorganic film and a silicon oxide film having a thickness of 600-1000 Å as the second inorganic film alternately stacked 2 to 5 times.

4. The image sensor of claim 1, wherein the blue color filter comprises a silicon film having a thickness of 300-600 Å as the first inorganic film and a silicon nitride film having a thickness of 400-800 Å, and
wherein the blue color filter comprises the silicon film and the silicon nitride film alternately stacked 2 to 5 times.

5. The image sensor of claim 1, wherein the insulating film comprises an interlayer insulating film, and wherein the color filters are arranged on the dopant regions of the semiconductor substrate below the insulating film.

6. A CMOS image sensor comprising:
a semiconductor substrate;
a plurality of first dopant regions configured to sense light and a plurality of second dopant regions configured as source/drain regions, wherein the plurality of first dopant regions are separated from the plurality of second dopant regions in the semiconductor substrate;
a gate insulating film formed on the semiconductor substrate;
a plurality of gate electrodes formed on the gate insulating film between the first dopant regions and the second dopant regions;
a plurality of color filters arranged corresponding to each of the plurality of first dopant regions and formed by alternately stacking 2 to 5 times a first inorganic film material and a second inorganic film material having a refractive index difference of about 0.8 or more;
a first interlayer insulating film formed on the gate electrode and the gate insulating film;
a first metal wire arranged on the first insulating film that does not correspond to the first dopant regions;
a second interlayer, insulating film formed on the first metal wire and the first interlayer insulating film;
a second metal wire arranged on the second interlayer insulating film that does not correspond to the first dopant regions;
a third interlayer insulating film formed on the second metal wire and the second interlayer insulating film;
a third metal wire arranged on the third interlayer insulating film that does not correspond to the first dopant regions;
a fourth interlayer insulating film formed on the third metal wire and the third interlayer insulating film; and
a plurality of micro lenses arranged on the fourth interlayer insulating film corresponding to each of the plurality of color filters.

7. The CMOS image sensor of claim 6, wherein the plurality of color filters are arranged on the gate insulating film together with the gate electrodes.

8. The CMOS image sensor of claim 6, wherein the plurality of color filters comprise red, green, and blue color filters, and wherein at least one of the first inorganic films of the red, green, and blue color filters is formed of an inorganic material different from the others of the red, green, and blue color filters, and at least one of the second inorganic films of the red, green, and blue color filters is formed of an inorganic material different from the others of the red, green, and blue color filters.

9. The CMOS image sensor of claim 8, wherein the red color filter comprises a silicon oxide film having a thickness of 600-800 Å as the first inorganic film and a silicon film having a thickness of 100-200 Å as the second inorganic film, and
wherein the red color filter comprises the silicon oxide film and the silicon film alternately stacked 2 to 5 times.

10. The CMOS image sensor of claim 8, wherein the green color filter comprises a silicon oxide film having a thickness of 700-1100 Å as the first inorganic film and a silicon film having a thickness of 500-800 Å as the second inorganic film alternately stacked 2 to 5 times, or comprises a silicon oxynitride film having a thickness of 800-1200 Å as the first inorganic film and a silicon oxide film having a thickness of 600-1000 Å as the second inorganic film alternately stacked 2 to 5 times.

11. The CMOS image sensor of claim 8, wherein the blue color filter comprises a silicon film having a thickness of 300-600 Å as the first inorganic film and a silicon nitride film having a thickness of 400-800 Å, and
wherein the blue color filter comprises the silicon film and the silicon nitride film alternately stacked 2 to 5 times.

* * * * *